(12) United States Patent
Abe et al.

(10) Patent No.: US 10,929,585 B2
(45) Date of Patent: Feb. 23, 2021

(54) RECORDING MEDIUM RECORDING VIA LIFETIME CALCULATION PROGRAM, VIA LIFETIME CALCULATION METHOD, AND INFORMATION PROCESSING DEVICE

(71) Applicant: FUJITSU LIMITED, Kawasaki (JP)

(72) Inventors: Mitsunori Abe, Kawasaki (JP); Yoshiyuki Hiroshima, Nakano (JP); Takahiro Kitagawa, Kawasaki (JP); Naoki Nakamura, Hachioji (JP); Akiko Matsui, Meguro (JP)

(73) Assignee: FUJITSU LIMITED, Kawasaki (JP)

( * ) Notice: Subject to any disclaimer, the term of this patent is extended or adjusted under 35 U.S.C. 154(b) by 188 days.

(21) Appl. No.: 16/239,978

(22) Filed: Jan. 4, 2019

(65) Prior Publication Data
US 2019/0220564 A1 Jul. 18, 2019

(30) Foreign Application Priority Data
Jan. 16, 2018 (JP) .............................. JP2018-004655

(51) Int. Cl.
| | |
|---|---|
| *G06F 30/367* | (2020.01) |
| *H05K 1/11* | (2006.01) |
| *G01R 31/28* | (2006.01) |
| *H05K 3/00* | (2006.01) |

(52) U.S. Cl.
CPC ....... *G06F 30/367* (2020.01); *G01R 31/2817* (2013.01); *H05K 1/115* (2013.01); *H05K 3/0005* (2013.01); *G01R 31/2846* (2013.01)

(58) Field of Classification Search
CPC .......................... G06F 30/367; G01R 31/2817
USPC .......................................................... 716/136
See application file for complete search history.

(56) References Cited

U.S. PATENT DOCUMENTS

| | | | | |
|---|---|---|---|---|
| 10,303,541 | B2 * | 5/2019 | Milor ...................... G06F 30/33 |
| 2006/0222833 | A1 * | 10/2006 | Maeng, II .............. H05K 3/107 |
| | | | | 428/209 |
| 2007/0033555 | A1 * | 2/2007 | Banoo ................... G06F 30/367 |
| | | | | 716/115 |
| 2007/0155160 | A1 * | 7/2007 | Allman ............. H01L 21/76838 |
| | | | | 438/620 |
| 2007/0259518 | A1 * | 11/2007 | Allman ............. H01L 21/76808 |
| | | | | 438/622 |

(Continued)

FOREIGN PATENT DOCUMENTS

| | | |
|---|---|---|
| JP | 2001-125945 | 5/2001 |
| JP | 2006-313800 | 11/2006 |

*Primary Examiner* — Suchin Parihar
(74) *Attorney, Agent, or Firm* — Fujitsu Patent Center

(57) ABSTRACT

A recording medium recording a program for a process, the process includes: calculating an amount of distortion in a via of a printed circuit board based on an expression using coefficient m, $\Delta\varepsilon=\{(L\times\alpha\times\Delta t\times E)/(D\times T)\}\times m$, where $\Delta\varepsilon$ is the amount of distortion, L is a length of the via, $\alpha$ is a thermal expansion coefficient of a base material, $\Delta t$ is a temperature change of an environment, E is a Young's modulus, D is a diameter of the via, and T is a thickness of plating in the via; and calculating a lifetime of the via based on an expression, $M=N/(n\times 365)$, where M is the lifetime of the via, n is a frequency of the temperature change, and N is the number of cycles of the lifetime satisfying an expression $N^x=C/\Delta\varepsilon$.

20 Claims, 16 Drawing Sheets

(56) References Cited

U.S. PATENT DOCUMENTS

| | | | |
|---|---|---|---|
| 2009/0015278 A1* | 1/2009 | Dang | H05K 1/0271 |
| | | | 324/762.06 |
| 2009/0077508 A1* | 3/2009 | Rubin | G06F 30/367 |
| | | | 716/136 |
| 2015/0379188 A1* | 12/2015 | Kahng | G06F 30/398 |
| | | | 716/53 |
| 2017/0255507 A1* | 9/2017 | Milor | G06F 11/073 |
| 2017/0255732 A1* | 9/2017 | Milor | G11C 29/50004 |
| 2020/0026816 A1* | 1/2020 | Abe | G06F 30/39 |

\* cited by examiner

FIG. 7

| FIRST INPUT SCREEN | USER NAME : TARO FUJI   ✕ |

PRINTED BOARD SPECIFICATION — 10

- 11 VIA LENGTH (L) = ☐ mm
- 12 VIA DIAMETER (D) = ☐ mm
- 13 PLATING THICKNESS (T) = ☐ μm

BASE MATERIAL PHYSICAL PROPERTIES — 20

- 21 THERMAL EXPANSION COEFFICIENT (α) = ☐ 1/K
- 22 GLASS TRANSITION TEMPERATURE = ☐ ℃
- 23 YOUNG'S MODULUS (E) = ☐ GPa

USE ENVIRONMENT — 30

- 31 MAXIMUM TEMPERATURE (Tmax) = ☐ ℃
- 32 MINIMUM TEMPERATURE (Tmin) = ☐ ℃
- 33 TEMPERATURE CHANGE FREQUENCY (n) = ☐ TIMES/DAY

REQUESTED LIFETIME — 40

- 41 REQUESTED YEARS = ☐ YEARS
- 42 SAFETY FACTOR = ☐

BT1 CALL | BT2 TO NEXT SCREEN | BT3 CLEAR

FIG. 8

| SECOND INPUT SCREEN | USER NAME : TARO FUJI | ✕ |

● CORRECTION INFORMATION

LAND ARRANGEMENT ($\beta$) = ☐ — 51

VIA ARRANGEMENT DENSITY ($\gamma$) = ☐ — 52

POSITIONAL DEVIATION BETWEEN VIA AND LAND ($\eta$) = ☐ — 53

⊞ ADDITION — 50

| CALL | PREDICTIVE EXECUTION | CLEAR |
| BT4 | BT5 | BT6 |

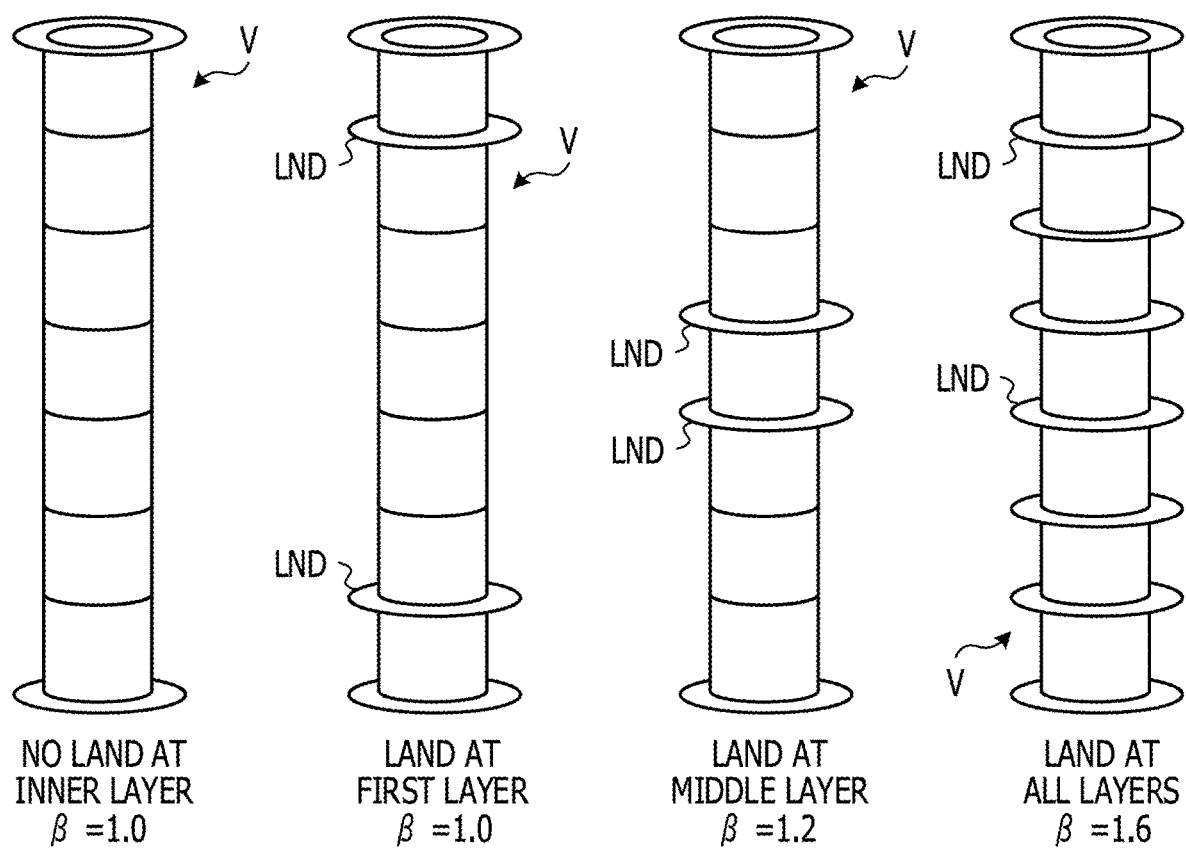

VIA DENSITY : 32 PCS/cm$^2$
$\gamma = 1.3$

VIA DENSITY : 16 PCS/cm$^2$
$\gamma = 1.0$

VIA DENSITY : 8 PCS/cm$^2$
$\gamma = 0.8$

VIA DENSITY : 4 PCS/cm$^2$
$\gamma = 0.7$

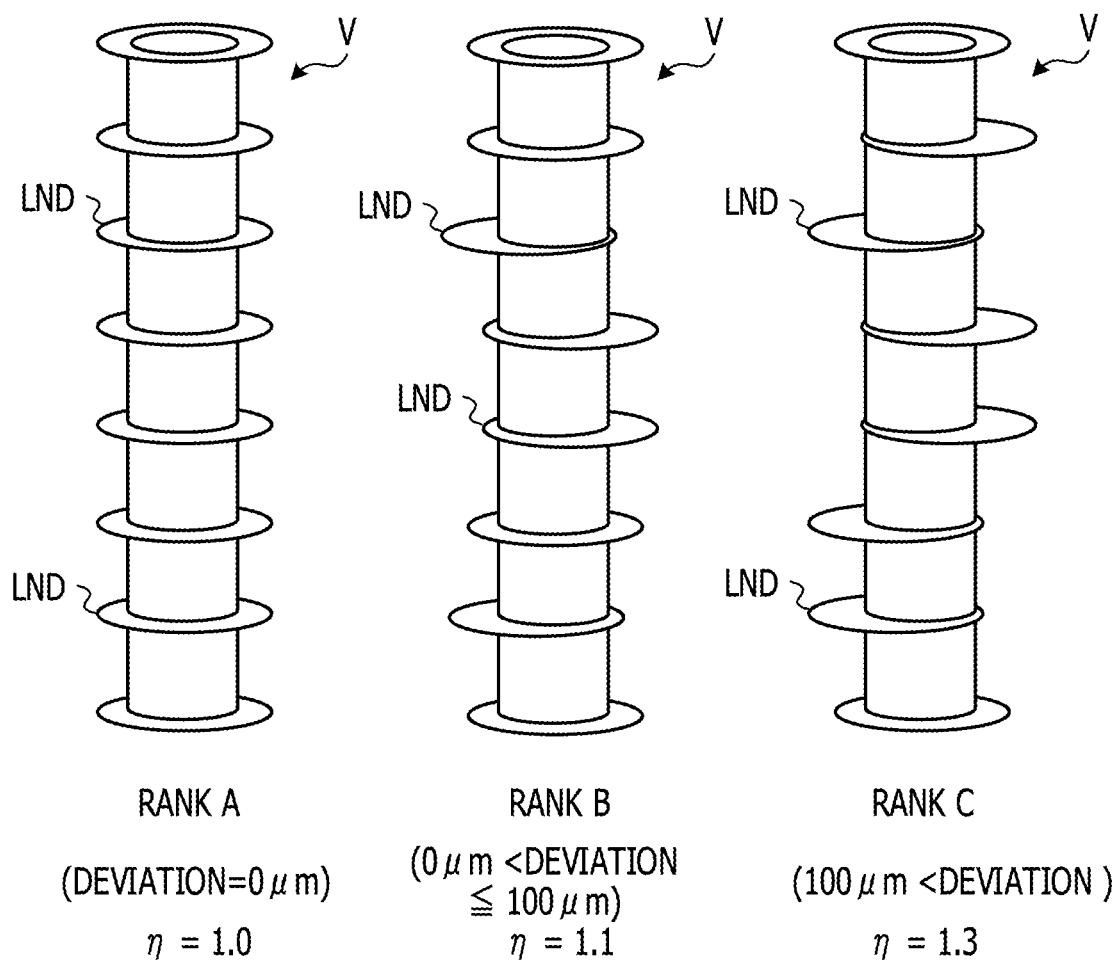

RANK A    RANK B    RANK C

FIG. 13A

```
┌─────────────────────────────────────────────────────┐
│ OUTPUT SCREEN              USER NAME : TARO FUJI  X │
│                                                     │
│    ● PREDICTION RESULT                              │
│                                                     │
│      LIFETIME OF VIA (SAFETY FACTOR: 1) = [  ] YEAR │ — 61
│                                                     │
│      DETERMINATION ON REQUESTED LIFETIME = [  ]     │ — 62
│                                                     │
│                                                     │
│   LIFETIME OF VIA (SAFETY FACTOR: INPUT VALUE) = [  ] YEAR │ — 63
│                                                     │
│      DETERMINATION ON REQUESTED LIFETIME = [  ]     │ — 64
│                                                     │
└─────────────────────────────────────────────────────┘
```

FIG. 13B

```
┌─────────────────────────────────────────────────────┐
│ OUTPUT SCREEN              USER NAME : TARO FUJI  X │
│                                                     │
│    ● PREDICTION RESULT                              │
│                                                     │
│      LIFETIME OF VIA (SAFETY FACTOR: 1) = [15.61] YEARS │ — 61
│                                                     │
│      DETERMINATION ON REQUESTED LIFETIME = [ OK ]   │ — 62
│                                                     │
│                                                     │
│   LIFETIME OF VIA (SAFETY FACTOR: INPUT VALUE) = [14.19] YEARS │ — 63
│                                                     │
│      DETERMINATION ON REQUESTED LIFETIME = [ OK ]   │ — 64
│                                                     │
└─────────────────────────────────────────────────────┘
```

US 10,929,585 B2

RECORDING MEDIUM RECORDING VIA LIFETIME CALCULATION PROGRAM, VIA LIFETIME CALCULATION METHOD, AND INFORMATION PROCESSING DEVICE

CROSS-REFERENCE TO RELATED APPLICATION

This application is based upon and claims the benefit of priority of the prior Japanese Patent Application No. 2018-4655, filed on Jan. 16, 2018 the entire contents of which are incorporated herein by reference.

FIELD

The embodiments discussed herein are related to a recording medium recording a via lifetime calculation program, a via lifetime calculation method, and an information processing device.

BACKGROUND

The fatigue lifetime of solder balls joining the printed circuit board and the semiconductor device is predicted. A predicted value of the lifetime of the solder joint portion is calculated.

Examples of the related art are disclosed in Japanese Laid-open Patent Publication No. 2006-313800 and Japanese Laid-open Patent Publication No. 2001-125945.

SUMMARY

According to an aspect of the embodiments, a non-transitory recording medium recording a via lifetime calculation program that causes a computer to execute a process, the process includes: calculating an amount of distortion occurring in a via of a printed circuit board based on an expression using coefficient m obtained by a stress calculation and a stress simulation which are based on a theory of material dynamics, $\Delta\varepsilon=\{(L\times\alpha\times\Delta t\times E)/(D\times T)\}\times m$, where $\Delta\varepsilon$ is the amount of distortion, L is a length of the via, $\alpha$ is a thermal expansion coefficient of a base material of the printed circuit board, $\Delta t$ is a temperature change of an environment in which the printed circuit board is used, E is a Young's modulus of the base material of the printed circuit board, D is a diameter of the via, and T is a thickness of plating in the via; and calculating a lifetime of the via based on an expression, $M=N/(n\times 365)$, where M is the lifetime of the via, n is a frequency of the temperature change, and N is the number of cycles of the lifetime satisfying an expression $N^x=C/\Delta\varepsilon$, where X is a fatigue ductility exponent of a material used for plating, and C is a fatigue ductility coefficient of the material used for plating.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 illustrates an example of a first input screen;

FIG. 8 illustrates an example of a second input screen;

FIGS. 9A to 9D are diagrams for describing of an example of a land arrangement;

FIGS. 11A to 11C are diagrams for describing examples of positional deviation between a via and a land;

FIGS. 13A and 13B illustrate examples of output screens;

DESCRIPTION OF EMBODIMENTS

For example, since a printed circuit board is a composite of an insulator material (for example, an organic resin, a composite material of an organic resin and a glass cloth, and an inorganic material) and a conductive metal (for example, copper), the internal stress is generated in the insulator material and the metal when the temperature outside the printed circuit board changes. For example, cracks may occur in a via or a through hole (hereinafter simply referred to as via) in the printed circuit board depending on the internal stress generated in the insulator material and the metal. The via means a plated hole for connecting conductor layers with respect to a printed circuit board with two or more layers. Copper is often used for plating.

For example, since various electronic components such as a semiconductor device mounted on a printed circuit board are connected through the via, a connection failure may occur between the components when the crack is generated in the via. In this manner, the crack generated in the via is a factor that lowers the connection strength between the parts. Therefore, for example, reliability of the printed circuit board may be grasped at the design stage by calculating the lifetime of a via based on the crack.

For example, a via lifetime calculation program or the like capable of calculating the lifetime of the via may be provided.

Hereinafter, embodiments discussed herein will be described with reference to the drawings.

First Embodiment

Figure 1:
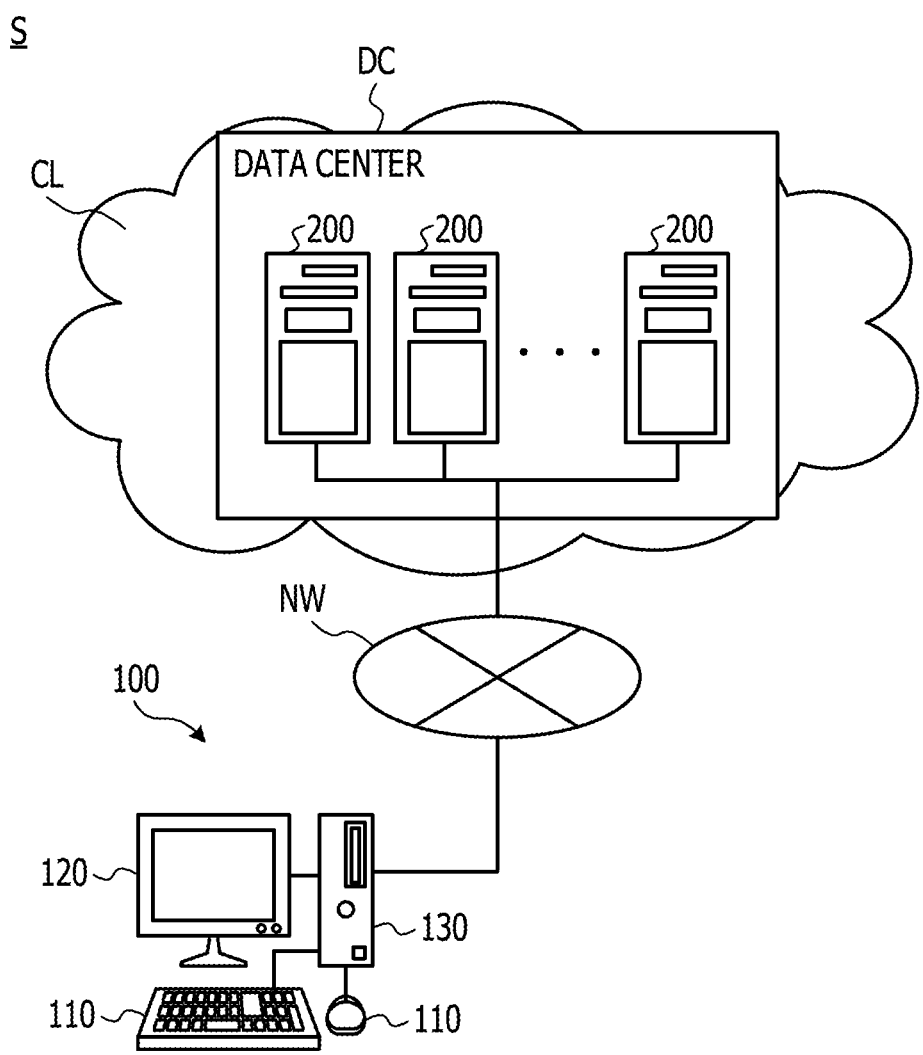
FIG. 1 is a diagram of an example of a via lifetime calculation system.

FIG. 1 is a diagram of an example of a via lifetime calculation system S. The via lifetime calculation system S includes a terminal device 100 and a server device 200 as a device that calculates a via lifetime. The terminal device 100 is used at the design stage by a designer of a printed circuit board, a person concerned, and so forth (hereinafter simply referred to as a user). In FIG. 1, although a personal computer (PC) is illustrated as an example of the terminal device 100, a smart device may be used. Examples of the smart device include a smartphone and a tablet terminal. On the other hand, the server device 200 is provided in the data center DC or the like on a cloud CL. In this way, a base of the server device 200 may be different from a base of the terminal device 100. The two bases may be the identical base such as the base in the identical office, for example. For example, the server device 200 may be a cloud type or an on-premise type.

The terminal device 100 and the server device 200 are connected to each other via a communication network NW. The communication network NW includes, for example, the Internet. Therefore, the terminal device 100 may be connected to the server device 200 through wireless communication or wired communication. When the terminal device 100 and the server device 200 are installed at the identical base, a local area network (LAN) or the like is used as the communication network NW. In this case, the server device 200 is provided in, for example, a server room.

The terminal device 100 includes an input device 110, a display device 120, and a control device 130. The input device 110 and the display device 120 are connected to the control device 130. The control device 130 controls the contents displayed by the display device 120 based on the input information input from the input device 110. The control device 130 transmits input information input from the input device 110 to the server device 200, and receives screen information and output information transmitted from the server device 200. The control device 130 causes the display device 120 to display various screens based on the received screen information, and outputs the result processed by the server device 200 in the screen based on the received output information. Details of screen information and output information will be described later.

Next, with reference to FIG. 2, a hardware configuration of the server device 200 will be described. Since the above-described control device 130 basically has a hardware configuration identical to that of the server device 200, its description will be omitted.

Figure 2:
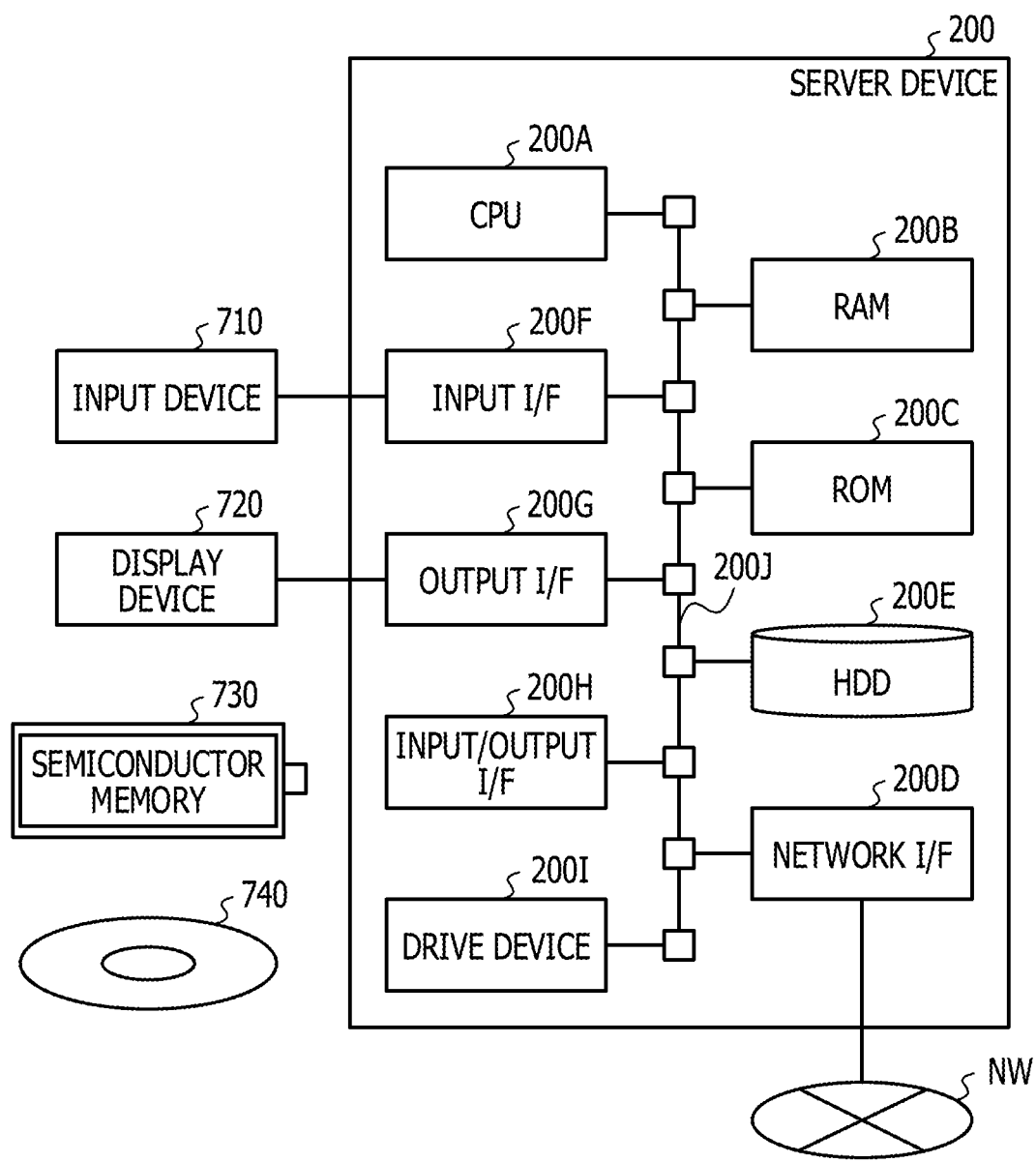
FIG. 2 illustrates an example of a hardware configuration of a server device.

FIG. 2 illustrates an example of a hardware configuration of the server device 200. As illustrated in FIG. 2, the server device 200 includes at least a central processing unit (CPU) 200A, a random access memory (RAM) 200B, and a read only memory (ROM) 200C as a hardware processor, and a network interface (I/F) 200D. The server device 200 may include at least one of a hard disk drive (HDD) 200E, an input I/F 200F, an output I/F 200G, an input/output I/F 200H, and a drive device 200I, as occasion arises. The CPU 200A to the drive device 200I are connected to each other through an internal bus 200J. For example, the function of the server device 200 may be implemented by a computer. Instead of the CPU 200A, a micro processing unit (MPU) may be used as a hardware processor.

An input device 710 is connected to the input I/F 200F. Examples of the input device 710 include a keyboard and a mouse. The above-described input device 110 is similar to the input device 710. A display device 720 is connected to the output I/F 200G. An example of the display device 720 includes a liquid crystal display. The above-described display device 120 is similar to the display device 720. A semiconductor memory 730 is connected to the input/output I/F 200H. The semiconductor memory 730 includes, for example, a universal serial bus (USB) memory and a flash memory. The input/output I/F 200H reads a program and data stored in the semiconductor memory 730. The input I/F 200F and the input/output I/F 200H have, for example, USB ports. The output I/F 200G has, for example, a display port.

A portable recording medium 740 is inserted into the drive device 200I. Examples of the portable recording medium 740 include removable disks such as a compact disc (CD)-ROM and a digital versatile disc (DVD). The drive device 200I reads a program and data recorded on the portable recording medium 740. The network I/F 200D has, for example, a LAN port. The network I/F 200D is connected to the above-described communication network NW.

Programs stored in the ROM 200C and the HDD 200E are temporarily stored in the RAM 200B by the CPU 200A. Programs recorded in the portable recording medium 740 are temporarily stored in the RAM 200B by the CPU 200A. The stored programs are executed by the CPU 200A, so that the CPU 200A implements various functions to be described later and executes various processes to be described later. The program may correspond to a processing sequence diagram to be described later.

Next, functions of the terminal device 100 and the server device 200 will be described with reference to FIGS. 3 and 4.

Figure 3:
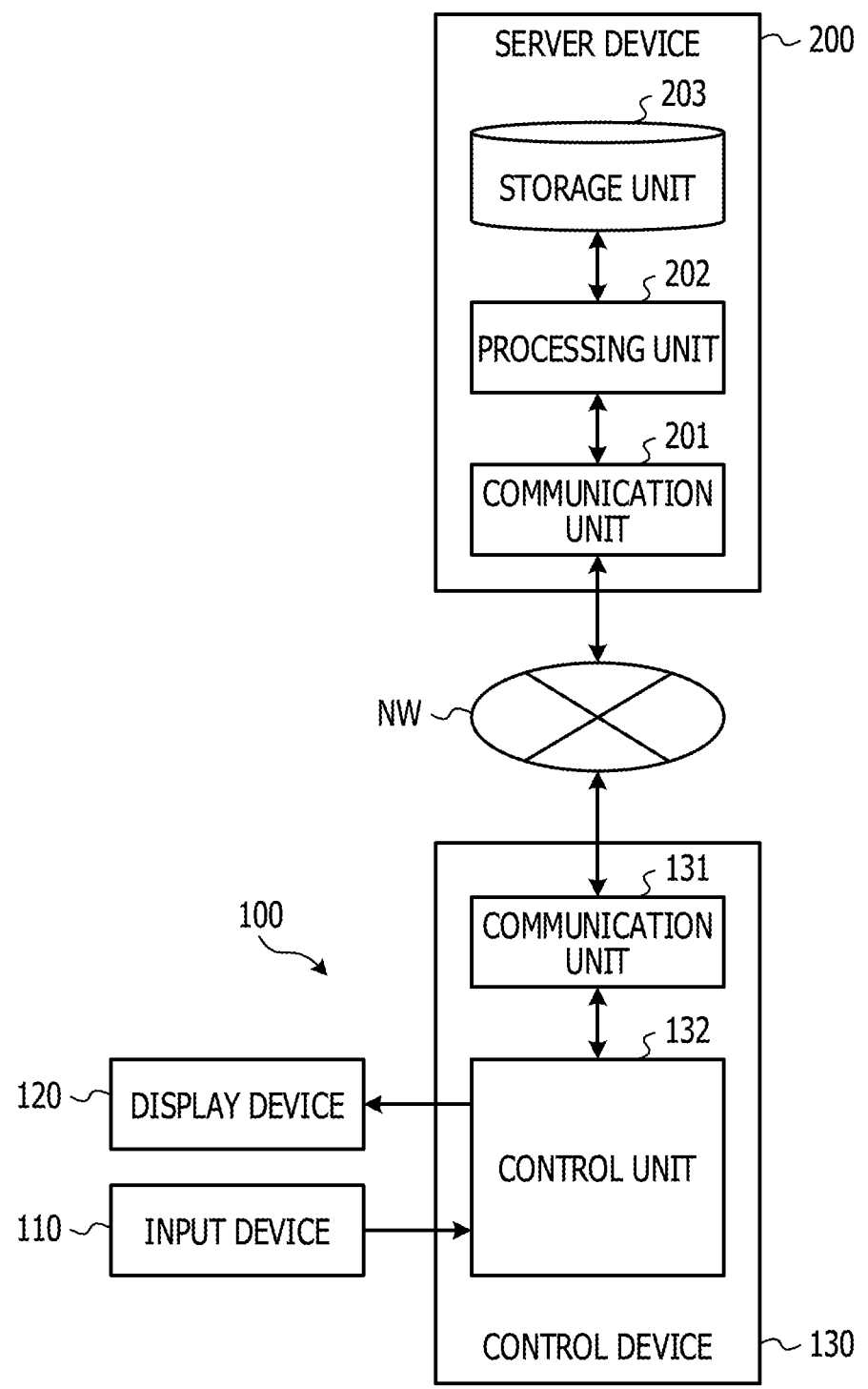
FIG. 3 is an example of a block diagram of a terminal device and the server device.
Figure 4:
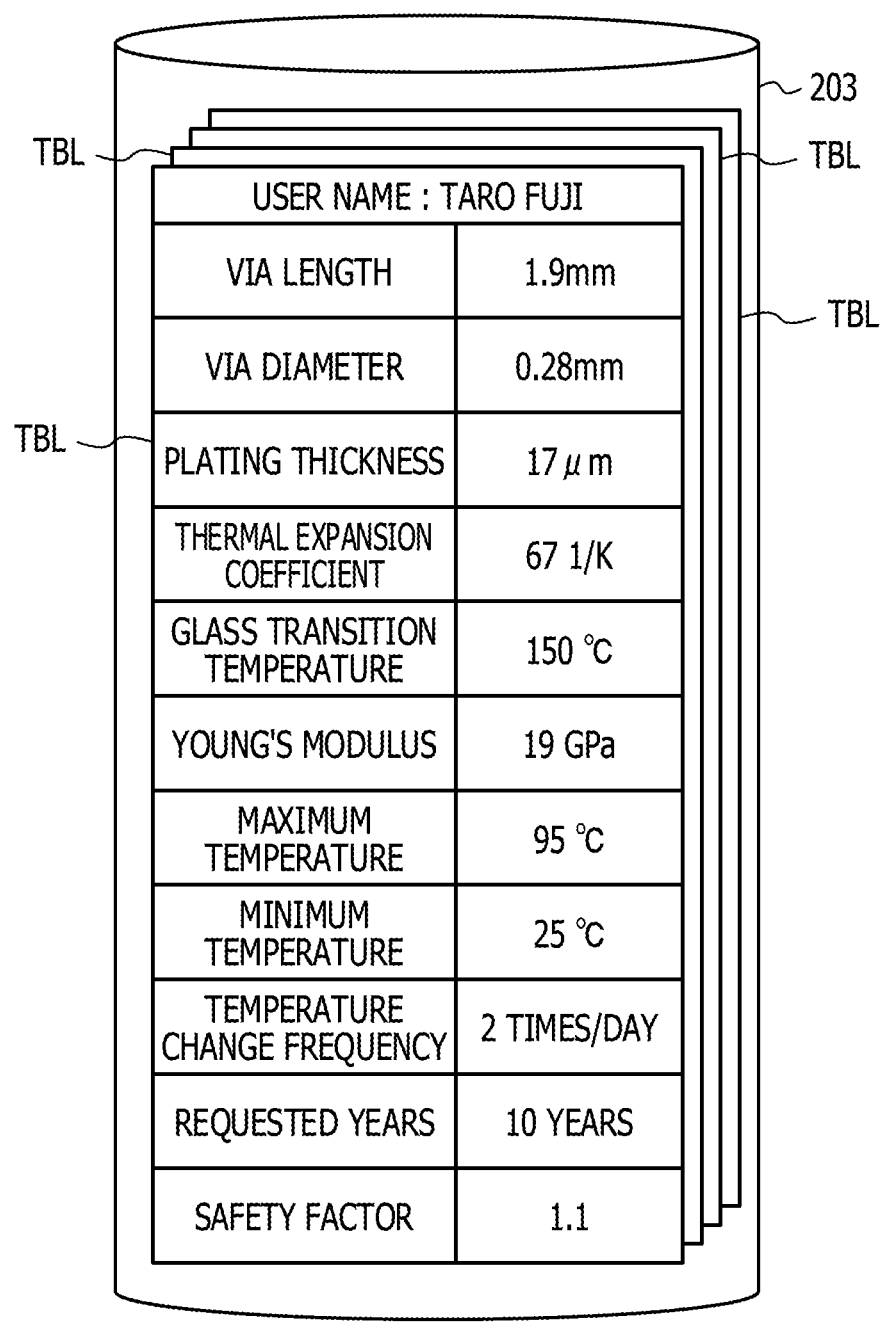
FIG. 4 illustrates an example of a storage unit.

FIG. 3 is an example of a block diagram of the terminal device 100 and the server device 200. For example, FIG. 3 illustrates the main parts of the functional configurations of the control device 130 and the server device 200. FIG. 4 illustrates an example of a storage unit 203.

First, the control device 130 will be described. As illustrated in FIG. 3, the control device 130 includes a communication unit 131 and a control unit 132. The function of the communication unit 131 may be implemented by, for example, the above-described network I/F 200D. The function of the control unit 132 may be implemented by, for example, the CPU 200A and the RAM 200B described above.

The communication unit 131 controls communication between the control device 130 and the server device 200. For example, the communication unit 131 transmits the input information output from the control unit 132 to the server device 200. For example, the communication unit 131 receives screen information and output information transmitted from the server device 200, and outputs them to the control unit 132. The screen information is information for causing the display device 120 to display various screens. The output information is information for outputting the result processed by the server device 200 in the output box in the screen displayed by the display device 120.

The control unit 132 controls the operation of the terminal device 100. For example, the control unit 132 receives input information from the input device 110. The input information includes, for example, an input value input in an input box in the screen, and an instruction based on a screen operation. The control unit 132 receives the screen information output from the communication unit 131 and causes the display device 120 to display various screens corresponding to the screen information. The control unit 132 receives the output information output from the communication unit 131, and outputs the result processed by the server device 200 to the output box in the screen displayed by the display device 120.

Next, the server device 200 will be described. As illustrated in FIG. 3, the server device 200 includes a communication unit 201, a processing unit 202, and the storage unit 203. The function of the communication unit 201 may be implemented by, for example, the above-described network I/F 200D. The function of the processing unit 202 may be implemented by, for example, the CPU 200A and the RAM 200B described above. The function of the storage unit 203 may be implemented by, for example, the above-described HDD 200E.

The communication unit 201 controls communication between the server device 200 and the control device 130. For example, the communication unit 201 transmits screen information and output information output from the processing unit 202 to the control device 130. For example, the communication unit 201 receives the input information transmitted from the control device 130 and outputs it to the processing unit 202.

The processing unit 202 receives the input information output from the communication unit 201. Upon receiving the input information, the processing unit 202 calculates the amount of distortion occurring in the via based on the received input information and a predetermined specific expression, and corrects the calculated amount of distortion. The via may or may not penetrate the printed circuit board. For example, the via may be a through via penetrating the printed circuit board, or may be an inner via (or a buried via) or a blind via which does not penetrate the printed circuit board. The processing unit 202 calculates the lifetime of the via based on the accepted input information, the calculated amount of distortion, and a predetermined specific expression, and performs the pass/fail determination of the calculated lifetime with respect to the requested lifetime. The processing unit 202 outputs the calculated lifetime and the result of the pass/fail determination to the communication unit 201. As a result, the communication unit 201 transmits the output information including the lifetime and the determination result. When receiving the input information, the processing unit 202 may associates identification information (for example, name) for identifying the user with the received input information to store them in the storage unit 203 as a history. In addition, the processing unit 202 performs various processes, details of which will be described later.

The storage unit 203 stores input information. For example, as illustrated in FIG. 4, the input information is managed for each user by a management table TBL having a plurality of input fields. The length of the via, the diameter of the via, and the thickness of plating are stored in respective input fields of the via length, the via diameter, and the plating thickness. For example, information on the specification of the printed circuit board is stored. The thermal expansion coefficient, the glass transition temperature, and the Young's modulus of the base material of the printed circuit board are stored in the respective input fields of the thermal expansion coefficient, the glass transition temperature and the Young's modulus. For example, information on the physical properties of the printed circuit board is stored. The maximum temperature, the minimum temperature and the change frequency per day in the maximum temperature and the minimum temperature in the environment in which the printed circuit board, or an electronic equipment whose electronic components are mounted on the printed circuit board is used are stored in respective input fields of the maximum temperature, the minimum temperature, the temperature change frequency. For example, information on the use environment of the printed circuit board or the electronic equipment is stored. The number of years related to the lifetime and the safety factor which the printed circuit board or the electronic equipment is to have are stored in respective input fields of the requested years and the safety factor. For example, information on the condition under which the printed circuit board or the electronic equipment is used is stored. Upon detecting the specific instruction to call the input information, the processing unit 202 described above acquires the input information from the storage unit 203 and outputs it to the communication unit 201.

An input field for storing information that affects the lifetime of the via may be provided in the management table TBL. Examples of the information that affects the lifetime of the via include a first coefficient corresponding to the land arrangement, a second coefficient corresponding to the via arrangement density with respect to the printed circuit board, and a third coefficient corresponding to the positional deviation between the via and the land. Examples of information that affects the lifetime of the via include a fourth coefficient corresponding to the size of the land, a fifth coefficient relating to the presence or absence of the solid layer, and a sixth coefficient relating to the physical property value of the resin filling the via. The management table TBL may store information on the specification of the printed circuit board designed by using an application program such as computer aided design (CAD) (hereinafter referred to as CAD application). The management table TBL may store information that affects the lifetime of the via designed using the CAD application.

Next, the operation of the via lifetime calculation system S will be described.

Figure 5:
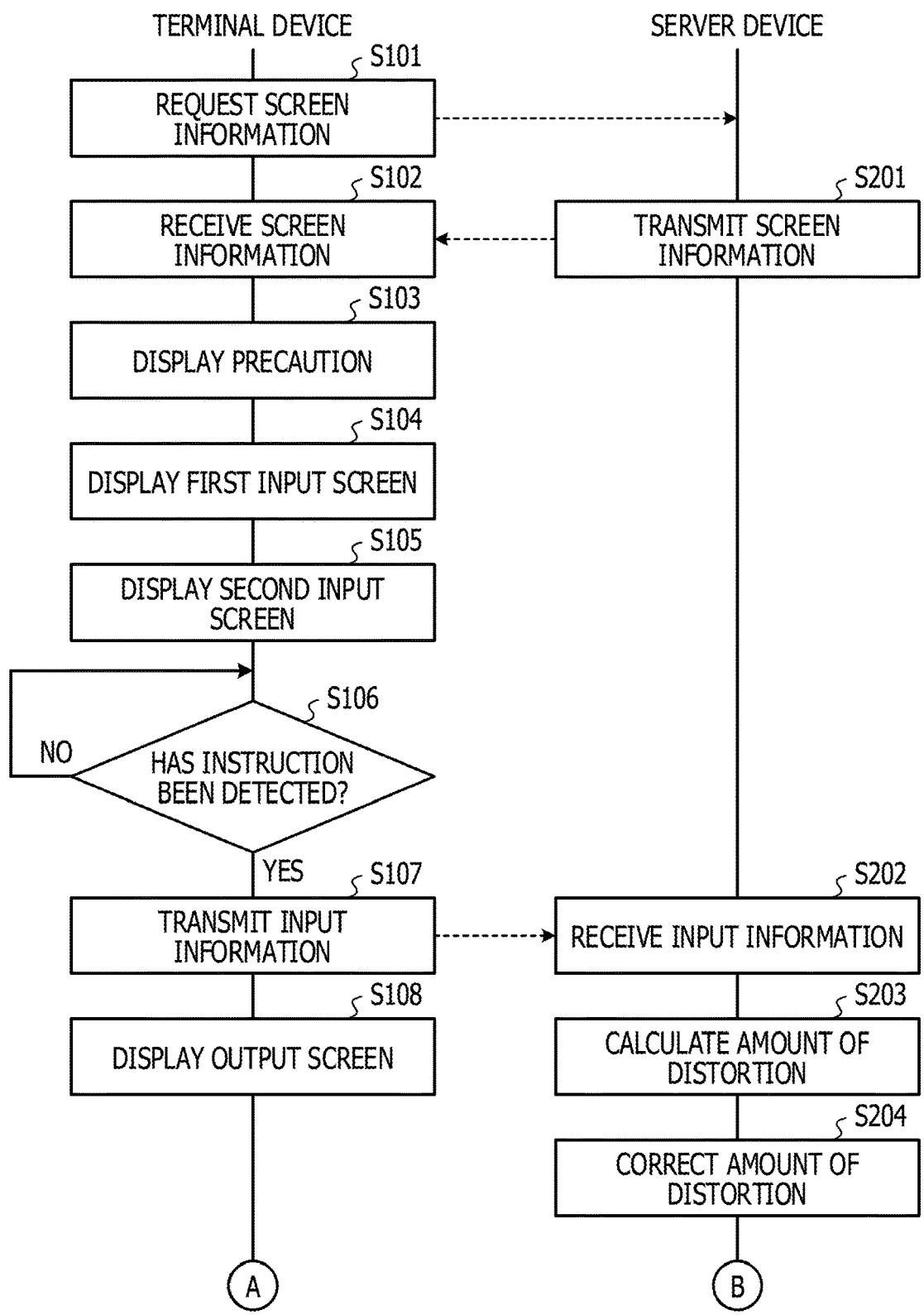
FIG. 5 is an example of a processing sequence diagram (part 1) of the via lifetime calculation system.
Figure 6:
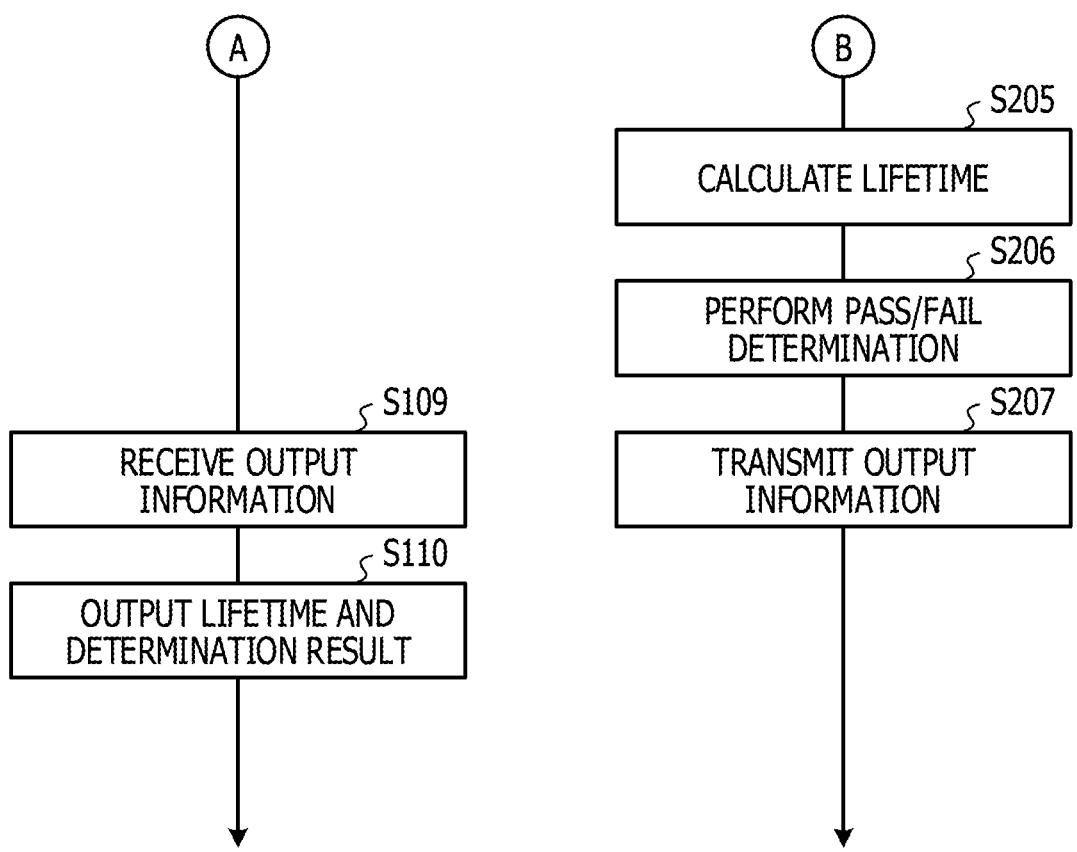
FIG. 6 is an example of a processing sequence diagram (part 2) of the via lifetime calculation system.

FIG. 5 is an example of a processing sequence diagram (part 1) of the via lifetime calculation system S. FIG. 6 is an example of a processing sequence diagram (part 2) of the via lifetime calculation system S. The processing sequence diagram illustrated in FIG. 5 and the processing sequence diagram illustrated in FIG. 6 are continuous by corresponding symbols.

First, the control unit 132 of the terminal device 100 requests screen information from the server device 200 (step S101). For example, when the user operates the input device 110 to input an instruction requesting a screen for predicting the lifetime of the via, the control unit 132 accepts the instruction input to the input device 110. Upon receiving the instruction, the control unit 132 requests the server device 200 to transmit the screen information to the terminal device 100. When the processing unit 202 of the server device 200 is requested by the terminal device 100 to transmit the screen information, the processing unit 202 transmits the screen information to the terminal device 100 through the communication unit 201 (step S201). As a result, the communication unit 131 of the terminal device 100 receives the screen information (step S102).

When the communication unit 131 receives the screen information, the control unit 132 causes the display device 120 to display a precaution (step S103), and causes the display device 120 to the first input screen (step S104). The precaution is noticed when using a process for predicting the lifetime of the via. Various pieces of information on the precaution, the first input screen, the second input screen to be described later, and the output screen are included in the screen information.

As illustrated in FIG. 7, the first input screen includes a plurality of input boxes 11, 12, and 13 for inputting the specification of the printed circuit board, and a plurality of input boxes 21 and 23 for inputting physical properties of the base material of the printed circuit board. The first input screen includes a plurality of input boxes 31, 32, and 33 for inputting the use environment of the printed circuit board or the electronic equipment, and a plurality of input boxes 41, 42 for inputting the requested lifetime of the printed circuit board or the electronic equipment. The input values input to the plurality of input boxes 11, . . . , 33 are used as basic information for calculating the amount of distortion of the via. On the other hand, the input values input to the plurality of input boxes 41, 42 are used as determination information for determining pass/fail of the lifetime of the via. For example, the safety factor, as an input value, input to the input box 42 is desirably appropriately selected within the range of 1.0 to 2.0 by the user since the requested values of the safety factor to be applied to electronic equipment are different for each electronic equipment.

In addition, the first input screen includes a plurality of selection boxes 10, 20, 30, and 40 for selecting an input method, and a plurality of operation buttons BT1, BT2, and BT3. The operation button BT1 represents an operable image area for invoking, from the storage unit 203, input information corresponding to the user name and displaying the invoked input information in the plurality of corresponding input boxes 11, . . . , 42. The operation button BT2 represents an operable image area for causing the display device 120 to display a second input screen to be described later. The operation button BT3 represents an operable image area for erasing numerical values displayed in the plurality of input boxes 11, . . . , 42.

The user operates the input device 110 to perform an operation of inputting numerical values to the plurality of input boxes 11, . . . , 42. The control unit 132 acquires the numerical values input to the input device 110 and causes the display device 120 to display the acquired numerical values in the input boxes 11, . . . , 42. Upon completing the operation of inputting the numerical values into the plurality of input boxes 11, . . . , 42, the user operates the input device 110 to perform an operation (for example, clicking) of pressing the operation button BT2. As a result, the control unit 132 detects an instruction to cause the display device 120 to display the second input screen, and causes the display device 120 to display the second input screen as illustrated in FIG. 5 (step S105). Upon causing the display device 120 to display the second input screen, the control unit 132 waits until it detects an instruction to cause the server device 200 to estimate the lifetime of the via (step S106: "NO").

As illustrated in FIG. 8, the second input screen includes an input box 51 for inputting an land arrangement, an input box 52 for inputting a via arrangement density, and an input box 53 for inputting a positional deviation between via and land. In addition, the second input screen includes an additional button 50 for adding another input box different from the plurality of input boxes 51, 52, and 53 and a plurality of operation buttons BT4, BT5, and BT6.

The numerical values input in the plurality of input boxes 51, 52, and 53 and another input box are used as correction information for correcting the amount of distortion of the via. The operation button BT4 represents an operable image area for invoking, from the storage unit 203, input information corresponding to the user name and displaying the invoked input information in the plurality of corresponding input boxes 51, 52, and 53, and the like. An operation button BT5 represents an operable image area for causing the server device 200 to predict the lifetime of the via. The operation button BT6 represents an operable image area for erasing numerical values displayed in the plurality of input boxes 51, 52, and 53, and the like.

For example, as illustrated in FIGS. 9A to 9D, a first coefficient $\beta$ corresponding to the presence or absence of the land LND and the arrangement of the lands LND is input to the input box 51. For example, in the case where the land LND is not disposed in the inner layer of a via V in view of the structure of the via V as illustrated in FIG. 9A, and in the case where the lands LND are arranged in the respective first layers of the via V as illustrated in FIG. 9B, 1.0, as the first coefficient $\beta$, is input to the input box 51 in accordance with the operation by the user. Similarly, in the case where the lands LND are arranged in the middle layers, which are the respective third layers of the via V in view of the structure of the via V as illustrated in FIG. 9C, 1.2, as the first coefficient $\beta$, is input to the input box 51 in accordance with the operation of the user. Similarly, in the case where the lands LND are arranged in all layers of the via V in view of the structure of the via V as illustrated in FIG. 9D, 1.6, as the first coefficient $\beta$, input to the input box 51 in accordance with the operation of the user. A specific numerical value of the first coefficient $\beta$ may be appropriately changed within a range where the accuracy of the lifetime may be improved.

Figure 10A:
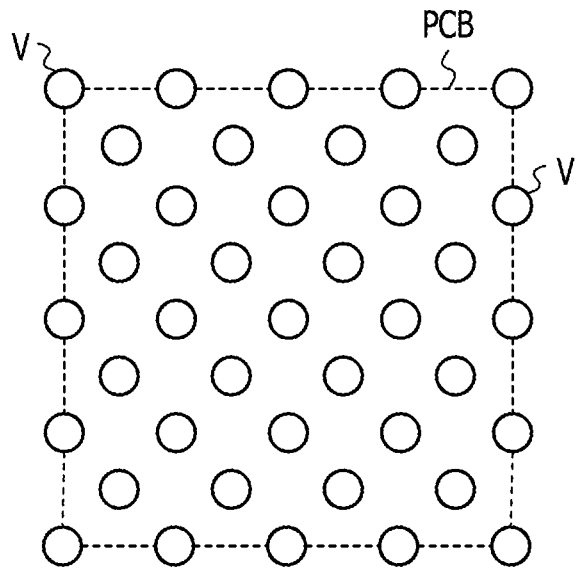
FIGS. 10A to 10D are diagrams for describing examples of via arrangement density.
Figure 10B:
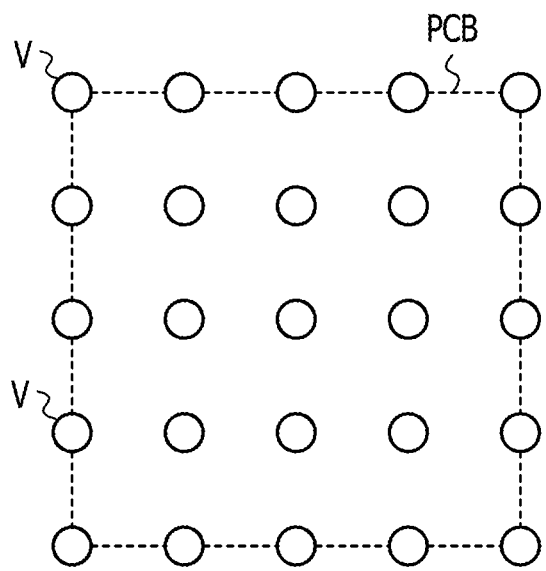
Figure 10C:
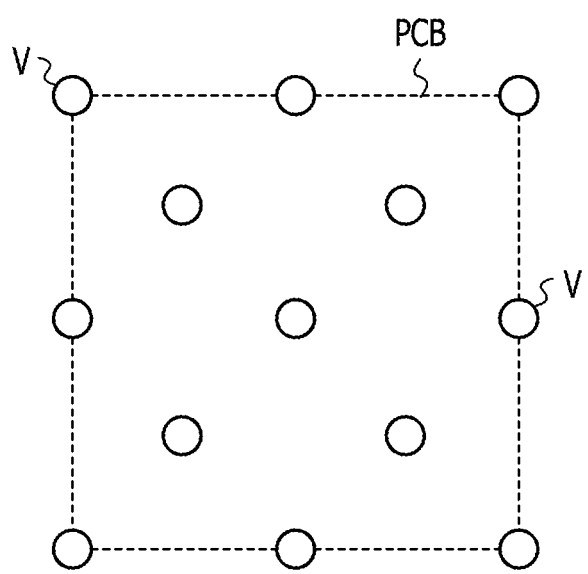
Figure 10D:
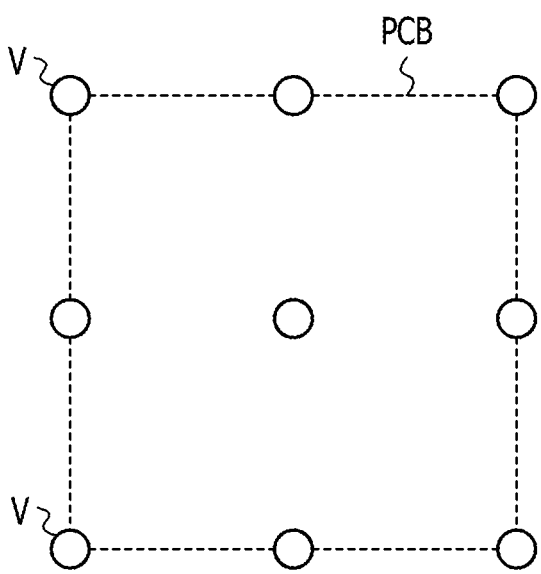

As illustrated in FIGS. 10A to 10D, a second coefficient $\gamma$ corresponding to the via V arrangement density with respect to the printed circuit board PCB is input to the input box 52. For example, in a case where 32 vias V (a quarter of a circle×4+a half of a circle×12+a circle×25) for an area of 1 $cm^2$ of the printed circuit board PCB are arranged in view of the structure of the via V as illustrated in FIG. 10A, 1.3 as the second coefficient $\gamma$ is input to the input box 52 in accordance with the operation of the user. Similarly, in a case where 16 vias V (a quarter of a circle×4+a half of a circle×12+a circle×9) for an area of 1 $cm^2$ of the printed circuit board PCB are arranged in view of the structure of the via V as illustrated in FIG. 10B, 1.0 as the second coefficient $\gamma$ is input to the input box 52 in accordance with the operation of the user. Similarly, in a case where 8 vias V (a quarter of a circle×4+a half of a circle×4+a circle×5) for an area of 1 $cm^2$ of the printed circuit board PCB are arranged in view of the structure of the via V as illustrated in FIG. 10C, 0.8 as the second coefficient $\gamma$ is input to the input box 52 in accordance with the operation of the user. Similarly, in a case where 4 vias V (a quarter of a circle×4+a half of a circle×4+a circle×1) for an area of 1 $cm^2$ of the printed circuit board PCB are arranged in view of the structure of the via V as illustrated in FIG. 10D, 0.7 as the second coefficient $\gamma$ is input to the input box 52 in accordance with the operation of the user. A specific numerical value of the second coefficient $\gamma$ may be appropriately changed within a range where the accuracy of the lifetime may be improved.

As illustrated in FIGS. 11A to 11C, a third coefficient $\eta$ corresponding to the positional deviation between the via V and the land LND is input to the input box 53. For example, as illustrated in FIG. 11A, in the case of rank A where the positional deviation between the via V and the lands LND is 0 µm in the process of processing the via V, 1.0, as the third coefficient $\eta$, is input to the input box 53 in accordance with the operation of the user. Similarly, in the case of rank B where the positional deviation between the via V and the lands LND is more than 0 µm and equal to or less than 100 µm in the process of processing the via V as illustrated in FIG. 11B, 1.1, as the third coefficient $\eta$, is input to the input box 53 in accordance with the operation of the user. Similarly, in the case of rank C where the positional deviation between the via V and the lands LND is more than 100 µm in the process of processing the via V as illustrated in FIG. 11C, 1.3, as the third coefficient $\eta$, is input to the input box 53 in accordance with the operation of the user. A specific numerical value of the third coefficient $\eta$ may be appropriately changed within the range where the accuracy of the lifetime may be improved.

Figures 12A, 12B, 12C:
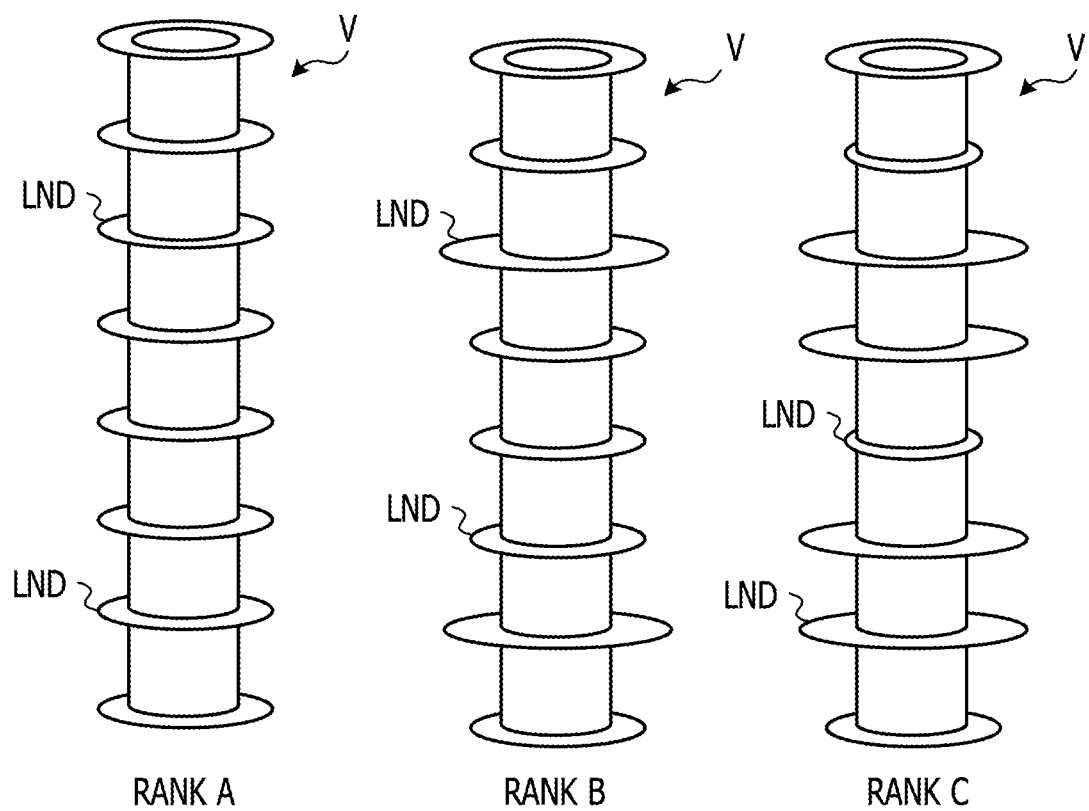
FIGS. 12A to 12C are diagrams for describing examples of variations in the sizes of the lands.

As illustrated in FIGS. 12A to 12C, in a case where the additional button 50 is pressed, a fourth coefficient corresponding to variations in the sizes of the lands LND to the via V may be input to another input box (not illustrated). For example, in a case of rank A where the lands LND have no or few variations in size in view of the structure of the via V as illustrated in FIG. 12A, a fourth coefficient corresponding to the rank A is input to another input box in accordance with the operation of the user. Similarly, in a case of rank B where the lands LND have small variations in size in view of the structure of the via V as illustrated in FIG. 12B, a fourth coefficient corresponding to the rank B is input to another input box in accordance with the operation of the user. Similarly, in a case of rank C where the lands LND have large variations in size in view of the structure of the via V as illustrated in FIG. 12C, a fourth coefficient corresponding to the rank C is input to another input box in accordance with the operation of the user. In addition, although not illustrated, in a case where the additional button 50 is pressed, a fifth coefficient relating to the presence or absence of a solid layer, a sixth coefficient relating to the physical property value of the resin filling the via V, and so forth may be input in other input boxes.

The user operates the input device 110 to perform an operation of inputting numerical values into the plurality of input boxes 51, 52, and 53 and another input box. The control unit 132 acquires the numerical value input to the input device 110 to cause the display device 120 to display the acquired numerical value in the input boxes 51, 52, and 53. Upon completion of the operation of inputting the numerical values into the plurality of input boxes 51, 52, and 53, the user operates the input device 110 to perform an operation (for example, clicking) of depressing the operation button BT5. As a result, as illustrated in FIG. 5, the control unit 132 detects an instruction to cause the server device 200 to predict the lifetime of the via (step S106: "YES"), and the communication unit 131 transmits the basic information, the determination information, and the input information including the correction information to the server device 200 (step S107). When the communication unit 131 transmits the input information to the server device 200, the control unit 132 causes the display device 120 to display an output screen (step S108). The control unit 132 may causes the display device 120 to display the output screen before transmitting the input information or may causes the display device 120 to display the output screen in parallel with the transmission of the input information.

As illustrated in FIG. 13A, the output screen has a plurality of output boxes 61, 62, 63, and 64 for outputting prediction results. The lifetime of the via V, which is the result processed by the server device 200, is output to each of the output boxes 61 and 63. For example, the lifetime when the safety factor is 1 is output to the output box 61, and the lifetime when the safety factor is the numerical value input on the first input screen is output to the output box 63. On the other hand, the result of the pass/fail determination by the server device 200 are output to the output boxes 62 and 64. Until receiving the output information, the control unit 132 causes the display device 120 to display an output screen on which all of the output boxes 61, 62, 63, and 64 are blank.

Returning to FIG. 5, the communication unit 201 of the server device 200 receives the input information transmitted from the terminal device 100 (step S202). When the communication unit 201 receives the input information, the processing unit 202 calculates the amount of distortion (step S203).

For example, the processing unit 202 calculates the amount of distortion based on the following expression (1) using the coefficient m obtained by the stress calculation and the stress simulation based on the theory of material dynamics.

$$\Delta\varepsilon = \{(L \times \alpha \times \Delta t \times E)/(D \times T)\} \times m \quad (1)$$

where $\Delta\varepsilon$ is the amount of distortion, and, in particular, represents the difference in distortion caused by the temperature change (the difference between the strain at the maximum temperature ($t_{max}$) and the strain at the minimum temperature ($t_{min}$)), L is the length of the via V, $\alpha$ is the thermal expansion coefficient of the base material of the printed circuit board PCB, $\Delta t$ is the temperature change of the environment in which the printed circuit board PCB and electronic equipment are used, and, in particular, may be expressed by a difference value between the maximum temperature and the minimum temperature input on the first input screen, E is the Young's modulus of the base material of the printed circuit board PCB, D is the diameter of the via V, and T is the thickness of plating in the via V.

The length of the via V, the thermal expansion coefficient, the maximum temperature, the minimum temperature, the Young's modulus, the diameter of the via V, and the thickness of plating, all of which are described above, are included in the basic information of the input information. Therefore, if the coefficient m is defined in advance, the processing unit 202 may calculate the amount of distortion. For example, when the coefficient m is defined within the range of $0.75 \times 10^{-4}$ to $1.5 \times 10^{-4}$, it is possible to calculate the amount of distortion with high accuracy. Furthermore, if the coefficient m is defined to be $1.4 \times 10^{-4}$, it is possible to calculate the more accurate amount of distortion.

In the process of step S203, the processing unit 202 calculates the amount of distortion, and then corrects the amount of distortion (step S204).

For example, the processing unit 202 corrects the amount of distortion based on the following expression (4).

$$\Delta\varepsilon' = \Delta\varepsilon \times \beta \times \gamma \times \eta \quad (4)$$

where $\beta$ is the first coefficient corresponding to the arrangement of the lands LND, $\gamma$ is the second coefficient corresponding to the via V arrangement density with respect to the printed circuit board PCB, and $\eta$ is the third coefficient corresponding to the positional deviation between the via V and the land LND. The expression (4) may be multiplied by at least one of the fourth to sixth coefficients described above. One or two of the first coefficient to the third coefficient may be excluded from the expression (4). The processing unit 202 may not perform the process of step S204, but the calculation accuracy of the lifetime of the via V may be improved by performing the process of step S204. The first coefficient and the third coefficient are included in the correction information of the input information. On the other hand, the fourth coefficient to the sixth coefficient may or may not be included in the correction information of the input information.

In the process of step S204, the processing unit 202 corrects the amount of distortion, and then calculates the lifetime as illustrated in FIG. 6 (step S205).

For example, the processing unit 202 calculates the lifetime based on the expression (2).

$$M = N/(n \times 365) \quad (2)$$

where M is the lifetime of the via V, N is the number of cycles of the lifetime that satisfies the expression (3) according to the Coffin-Manson rule described below, and n is the frequency of the temperature change.

$$N^x = C/\Delta\varepsilon \quad (3)$$

where x is the fatigue ductility exponent of the material used for plating, and C is the fatigue ductility coefficient of the material used for plating.

The above-described frequency of the temperature change is included in the basic information of the input information. Therefore, if the fatigue ductility exponent and the fatigue ductility coefficient are defined in advance, the processing unit 202 may calculate the lifetime. For fatigue ductility exponent and fatigue ductility coefficient, it is desirable to use values obtained from experiments on disruptive strength of copper.

In the process of step S205, the processing unit 202 calculates the lifetime, and then performs the pass/fail determination (step S206). For example, the processing unit 202 compares the lifetime calculated in the process in step S205 with the requested lifetime set as the lifetime requested for the via V to determines whether the calculated lifetime of the via V satisfies the requested lifetime.

For example, when the lifetime calculated in the process of step S205 is equal to or longer than the requested lifetime, the processing unit 202 determines that the calculated lifetime of the via V satisfies the requested lifetime. When the lifetime calculated by the process of step S205 is less than the requested lifetime, the processing unit 202 determines that the lifetime of the calculated via V does not satisfy the requested lifetime. The processing unit 202 calculates the requested lifetime based on the requested years for the safety factor (requested years/safety factor) to perform the pass/fail determination. For example, the processing unit 202 calculates the requested lifetime when the safety factor is 1 and the requested lifetime when the safety factor is the numerical value input on the first input screen to perform the pass/fail determination. The requested years and the safety factor are included in the determination information of the input information as described above.

In the process of step S206, when the processing unit 202 performs the pass/fail determination, the communication unit 201 transmits the output information (step S207). For example, the processing unit 202 outputs to the communication unit 201 the calculated lifetime and the result of the pass/fail determination by combining them for each safety factor and the communication unit 201 transmits the output information including the lifetime and the determination result for each safety factor. For example, the processing unit 202 outputs the output information to the terminal device 100 through the communication unit 201. In this embodiment, a character string such as "OK" or "NG" is used as a determination result, but symbols such as "○" or "×" may be used.

The communication unit 131 of the terminal device 100 receives the output information transmitted from the server device 200 (step S109). When the communication unit 131 receives the output information, the control unit 132 outputs the lifetime and the determination result (step S110). For example, the control unit 132 outputs the lifetime and the determination result for each safety factor to the output boxes 61, 62, 63, and 64 of the output screen. As a result, as illustrated in FIG. 13B, the lifetime of the via V when the safety factor is 1 is output to the output box 61, and the determination result with respect to the requested lifetime is output to the output box 62. Similarly, the lifetime of the via V when the safety factor is the input value is output to the output box 63, and the determination result with respect to the requested lifetime is output to the output box 64.

As described above, according to the first embodiment, the server device 200 includes the processing unit 202. The processing unit 202 may calculate the amount of distortion representing a quantity of distortion occurring in the via V (for example, the inside of the via V) of the printed circuit board PCB based on the above-described expression (1), and may calculate the lifetime of the via V based on the above-described expressions (2) and (3). As a result, the user may grasp the reliability of the printed circuit board PCB at the design stage, and may take countermeasures at an early stage, for example change the design at an appropriate time.

Figure 14:
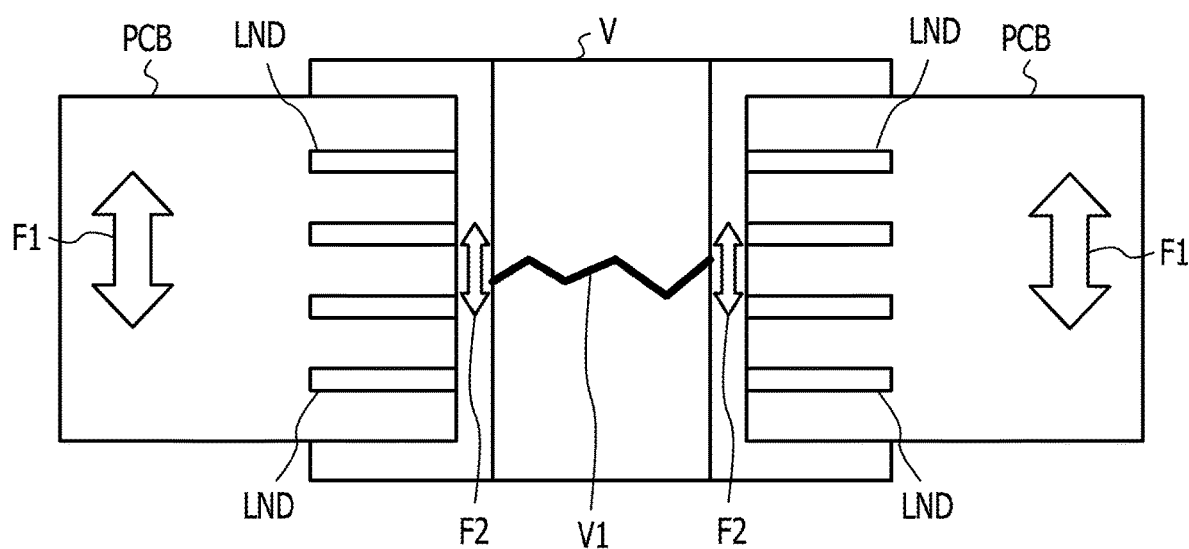
FIG. 14 is a diagram for describing an example of a crack occurring in a via.

For example, as illustrated in FIG. 14, since the physical properties of the base material of the printed circuit board PCB and the via V having the land LND are different from each other, when the temperature outside the printed circuit board PCB changes, a crack V1 may occur in the via V due to the difference in the respective internal stresses F1 and F2. If the crack V1 occurs before the requested lifetime, the printed circuit board PCB may not operate properly due to the crack V1. However, according to the first embodiment, since the user may design the printed circuit board PCB after predicting the lifetime of the via V, the reliability of the printed circuit board PCB may be secured. In the printed circuit board PCB in which materials having different thermal expansion coefficients are combined, the internal stress is generated at the via V due to the temperature change. Therefore, the internal stress similarly occurs when the insulator material is an inorganic material. In this case, it is possible to estimate the lifetime of the via V by calculating the amount of distortion of the via V by utilizing the simulation and so forth.

Second Embodiment

Figure 15A:
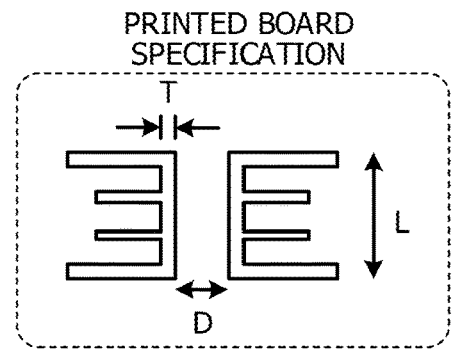
FIGS. 15A to 15D are diagrams for describing an example of an input method.
Figure 15B:
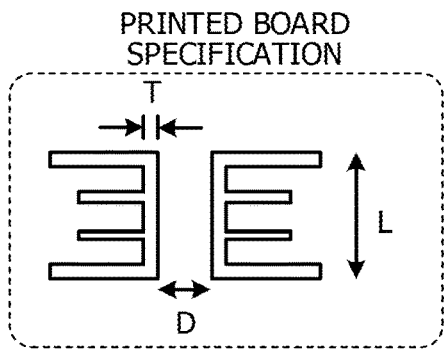

A second embodiment discussed herein will be described with reference to FIG. 15. FIGS. 15A to 15D are diagrams for describing an example of an input method. For example, in the above-described first embodiment, as illustrated in FIG. 15A, since a input method by direct input is selected in the selection box 10, a method of directly inputting numerical values to a plurality of input boxes 11, 12, and 13 is employed. However, the input method selected in the selection box 10 is not limited to the input method by the direct input. For example, as illustrated in FIG. 15B, an input method according to a design specification predetermined in the selection box 10 may be selected. For example, when the design specification SP1 is selected, the control unit 132 outputs the via length, the via diameter, and the plating thickness associated with the design specification SP1 to the plurality of input boxes 11, 12, and 13, respectively.

Figure 15C:
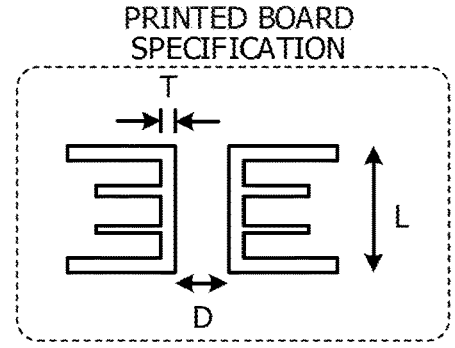
Figure 15D:
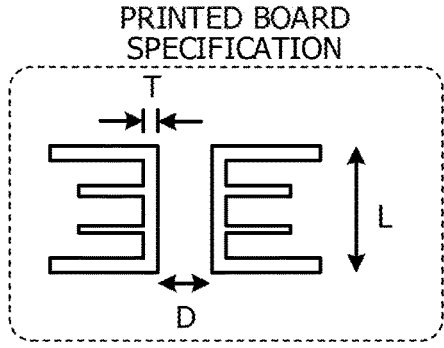

As illustrated in FIG. 15C, another input box 14 and an operation button BT7 different from the plurality of input boxes 11, 12, and 13 may be provided in the first input screen are provided, and the via length, the via diameter, and the plating thickness of the CAD data input to the input box 14 may be read by depressing the operation button BT7. When such an operation is performed, the control unit 132 outputs the via length, the via diameter, and the plating thickness to the plurality of input boxes 11, 12, and 13, respectively. Similarly, as illustrated in FIG. 15D, another input box 15 different from the plurality of input boxes 11, 12, and 13 and an operation button BT8 may be provided in the first input screen, and the via length, the via diameter, and the plating thickness of the data which were input to the input box 15 and that were used in the past may be read by depressing the operation button BT8. When such an operation is performed, the control unit 132 outputs the via length, the via diameter, and the plating thickness to the plurality of input boxes 11, 12, and 13, respectively. With the input method described above, it is possible to reduce the labor of input by the user. In the second embodiment, the specification of the printed circuit board have been described as an example, but the physical properties, the use environment, and the requested lifetime of the base material of the printed circuit board are also similarly processed as in the specification of the printed circuit board.

Third Embodiment

Figure 16:
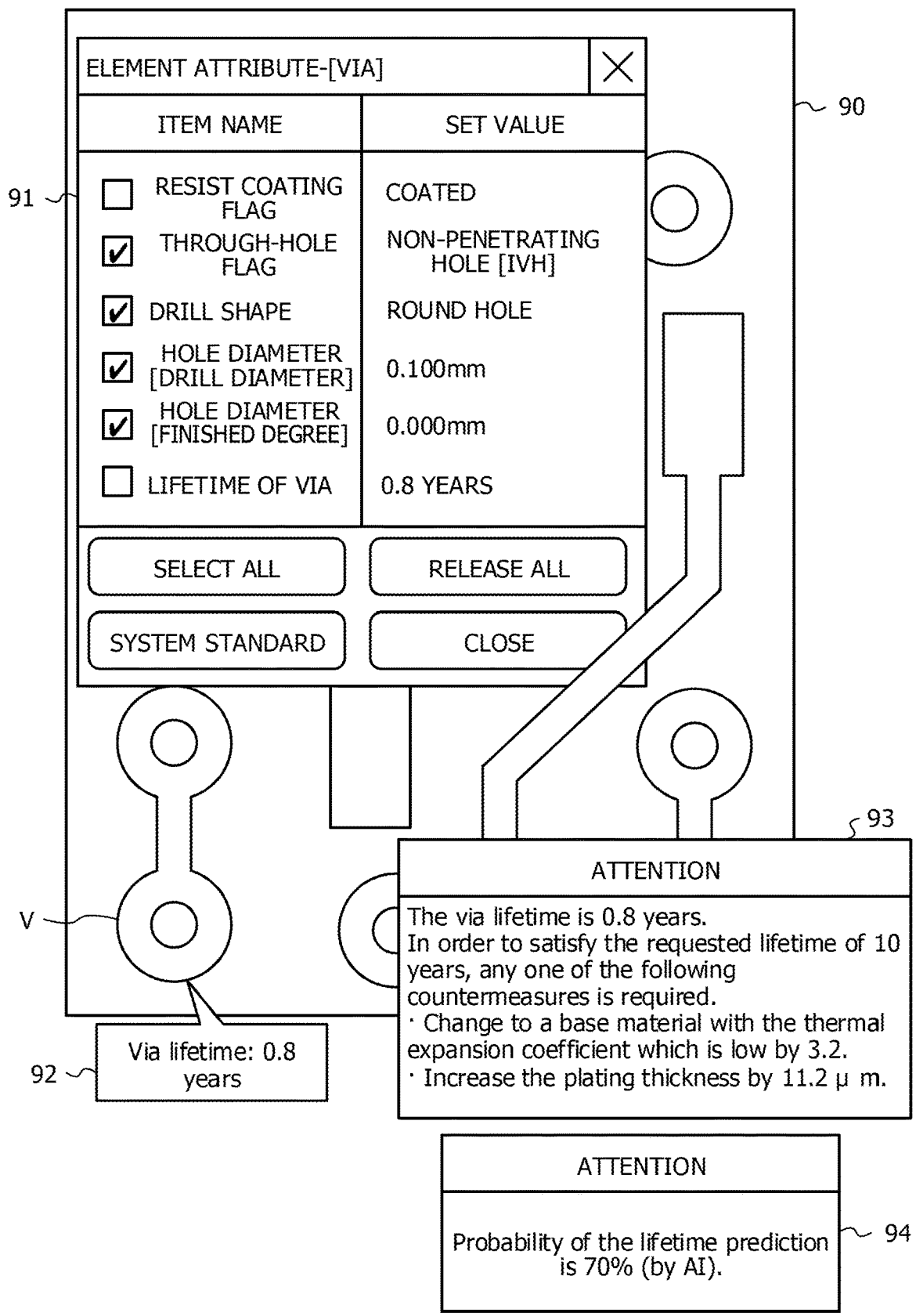
FIG. 16 is a diagram for describing an example of a output method.

A third embodiment discussed herein will be described with reference to FIG. 16. FIG. 16 is a diagram for describing an example of a output method. As illustrated in FIG. 16, the control unit 132 may output a pop-up screen 91 including the lifetime of the via V on a design screen 90 created using the CAD application. The control unit 132 may output a pop-up screen 92 including the lifetime of the via V to the outside of the design screen 90 in association with the via V in the design screen 90. The control unit 132 may output a pop-up screen 93 including countermeasures to satisfy the requested lifetime together with the lifetime of the via V. The control unit 132 may output a pop-up screen 94 including the probability of lifetime prediction calculated using an artificial intelligence (AI). The lifetime of the via V may be linked with the CAD application by the above-described output method.

Fourth Embodiment

A fourth embodiment discussed herein will be described. In the first embodiment described above, the processing unit 202 calculates the amount of distortion based on the expression (1). On the other hand, as described in the fourth embodiment, instead of expression (1), the processing unit 202 may analyze statistically the influence degree of each factor from the result of the stress simulation with factors that affect the amount of distortion of the via V as variables to calculate the amount of distortion based on the following approximate expression (5) which synthesizes a function of each factor and a function including the interaction of these factors. Factors that affect the amount of distortion of the via V include, for example, the length of the via V, the diameter of the via V, the thickness of the plating in the via V, the thermal expansion coefficient of the base material of the printed circuit board PCB, the Young's modulus of the base material of the printed circuit board PCB, and temperature change in the environment in which the printed circuit board is used.

$$\Delta\varepsilon = \{a \times f(L) + b \times f(T) + c \times f(D) + d \times f(\alpha) + e \times f(E) + g \times f(L, T, D, \alpha, E)\} \times \Delta t \quad (5)$$

where $\Delta\varepsilon$ is the amount of distortion, in particular, represents the difference in distortion caused by the temperature change (the difference between the strain at the maximum temperature ($t_{max}$) and the strain at the minimum temperature ($t_{min}$)), L is the length of the via, $\alpha$ is the thermal expansion coefficient of the base material of the printed circuit board, $\Delta t$ is the temperature change of the environment in which the printed circuit board is used, E is the Young's modulus of the base material of the printed circuit board, D is the diameter of the via, T is the thickness of the plating in the via, and a, b, c, d, e, and g are coefficients of an approximate expression of a simulation result by a stress simulation using, as variables, the length of the via, the diameter of the via, the thickness of the plating in the via, the thermal expansion coefficient of the base material of the printed circuit board, the Young's modulus of the base material of the printed circuit board, and the temperature change in the environment in which the printed circuit board is used. For example, the approximate expression (5) is an equation which is synthesized by carrying out a stress simulation with factors that affect the amount of distortion of the via as a variable to statistically analyze the influence degree of each factor. a, b, c, d, e, and g are coefficients of the approximate expression by the stress simulation result.

The approximate expression (6) described below may be used as an example of the approximate expression (5) described above.

$$\Delta\varepsilon = \{a \times \ln(L) + b \times T + c \times T^{0.4} + d \times D^{-0.2} + e \times E^2 + f \times E + (g \times E + h \times T + i) \times \alpha + j\} \times \Delta t \quad (6)$$

where $\Delta\varepsilon$ is the amount of distortion, and in particular, represents the difference in distortion caused by the temperature change (the difference between the strain at the maximum temperature ($t_{max}$) and the strain at the minimum temperature ($t_{min}$)), L is the length of the via, $\alpha$ is the thermal expansion coefficient of the base material of the printed circuit board, $\Delta t$ is the temperature change of the environment in which the printed circuit board is used, E is the Young's modulus of the base material of the printed circuit board, D is the diameter of the via, and T is the thickness of the plating in the via. For example, the approximate expression (6) is also an equation which is synthesized by carrying out a stress simulation with factors that affect the amount of distortion of the via as a variable to statistically analyze the influence degree of each factor. a, b, c, d, e, f, g, h, i, and j are coefficients of the approximate expression of the stress simulation result. In this manner, the processing unit 202 may calculate the amount of distortion of the via V based on the approximate expression (5) or the approximate expression (6), and may calculate the lifetime of the via V based on the above-described expressions (2) and (3).

Although the exemplary embodiments of the present disclosure has been described in detail above, the present disclosure is not limited to such specific embodiments, but various modifications and alterations may be made without departing from the spirit and scope of the present disclosure set forth in the claims. For example, in the above-described first embodiment, the control unit 132 causes the display device 120 to display the first input screen, the second input screen, and the output screen separately, but may causes the display device 120 to display an input/output screen in which the first input screen, the second input screen, and the output screen are combined into one. Part or all of the processing performed by the processing unit 202 may be performed by the control unit 132.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A non-transitory recording medium recording a via lifetime calculation program that causes a computer to execute a process, the process comprising:
  calculating an amount of distortion occurring in a via of a printed circuit board based on an expression using coefficient m obtained by a stress calculation and a stress simulation which are based on a theory of material dynamics, $\Delta\varepsilon = \{(L \times \alpha \times \Delta t \times E)/(D \times T)\} \times m$, where $\Delta\varepsilon$ is the amount of distortion, L is a length of the via, α is a thermal expansion coefficient of a base material, Δt is a temperature change of an environment in which the printed circuit board is used, E is a Young's modulus of the base material of the printed circuit board, D is a diameter of the via, and T is a thickness of plating in the via; and identifying a number M based on an expression, M=N/(n×365), where M is a lifetime of the via, n is a frequency of the temperature change, and N is the number of cycles of the lifetime satisfying an expression $N^X=C/\Delta\varepsilon$, where X is a fatigue ductility exponent of a material used for plating, and C is a fatigue ductility coefficient of the material used for plating.

2. The non-transitory recording medium according to claim 1, wherein the amount of distortion is corrected based on information that affects the lifetime.

3. The non-transitory recording medium according to claim 2, wherein the information includes at least one of a first coefficient corresponding to a land arrangement, a second coefficient corresponding to a via arrangement density with respect to the printed circuit board, a third coefficient corresponding to a positional deviation between a via and a land, a fourth coefficient corresponding a size of the land, a fifth coefficient related to presence or absence of a solid layer, and a sixth coefficient related to a physical property value of a resin filling the via.

4. The non-transitory recording medium according to claim 1, wherein the amount of distortion is corrected base on an expression $\Delta\varepsilon'=\Delta\varepsilon\times\beta\times\gamma\times\eta$, where β is a first coefficient corresponding to a land arrangement, γ is a second coefficient corresponding to a via arrangement density with respect to the printed circuit board, and η is a third coefficient corresponding to a positional deviation between a via and a land.

5. The non-transitory recording medium according to claim 1, wherein the process further comprises comparing a calculated lifetime of the via with a requested lifetime set as a lifetime requested for the via to determine whether the calculated lifetime of the via satisfies the requested lifetime.

6. The non-transitory recording medium according to claim 5, wherein the process further comprises outputting the calculated lifetime of the via and a result of the determination.

7. The non-transitory recording medium according to claim 1, wherein instead of the expression $\Delta\varepsilon=\{(L\times\alpha\times\Delta t\times E)/(D\times T)\}\times m$, the amount of distortion is calculated based on an approximate expression which, by statistically analyzing an influence degree of each factor from a result of a stress simulation with factors that affect the amount of distortion of the via as variables, synthesizes a function of each factor and a function including an interaction of each factor, $\Delta\varepsilon=\{a\times f(L)+b\times f(T)+c\times f(D)+d\times f(\alpha)+e\times f(E)+g\times f(L, T, D, \alpha, E)\}\times\Delta t$, where Δε is the amount of distortion, L is the length of the via, α is the thermal expansion coefficient of the base material of the printed circuit board, Δt is the temperature change of the environment in which the printed circuit board is used, E is the Young's modulus of the base material of the printed circuit board, D is the diameter of the via, T is the thickness of the plating in the via, and a, b, c, d, e, and g are coefficients of an approximate expression of a simulation result by a stress simulation using, as the variables, the length of the via, the diameter of the via, the thickness of the plating in the via, the thermal expansion coefficient of the base material of the printed circuit board, the Young's modulus of the base material of the printed circuit board, and the temperature change in the environment in which the printed circuit board.

8. A via lifetime calculation method comprising:
calculating, by a computer, an amount of distortion occurring in a via of a printed circuit board based on an expression using coefficient m obtained by a stress calculation and a stress simulation which are based on a theory of material dynamics, $\Delta\varepsilon=\{(L\times\alpha\times\Delta t\times E)/(D\times T)\}\times m$, where Δε is the amount of distortion, L is a length of the via, α is a thermal expansion coefficient of a base material of the printed circuit board, Δt is a temperature change of an environment in which the printed circuit board is used, E is a Young's modulus of the base material of the printed circuit board, D is a diameter of the via, and T is a thickness of plating in the via; and identifying a number M based on an expression, M=N/(n×365), where M is a lifetime of the via, n is a frequency of the temperature change, and N is the number of cycles of the lifetime satisfying an expression $N^X=C/\Delta\varepsilon$, where X is a fatigue ductility exponent of a material used for plating, and C is a fatigue ductility coefficient of the material used for plating.

9. The via lifetime calculation method according to claim 8, wherein the amount of distortion is corrected based on information that affects the lifetime.

10. The via lifetime calculation method according to claim 9, wherein the information includes at least one of a first coefficient corresponding to a land arrangement, a second coefficient corresponding to a via arrangement density with respect to the printed circuit board, a third coefficient corresponding to a positional deviation between a via and a land, a fourth coefficient corresponding a size of the land, a fifth coefficient related to presence or absence of a solid layer, and a sixth coefficient related to a physical property value of a resin filling the via.

11. The via lifetime calculation method according to claim 8, wherein the amount of distortion is corrected base on an expression $\Delta\varepsilon'=\Delta\varepsilon\times\beta\times\gamma\times\eta$, where β is a first coefficient corresponding to a land arrangement, γ is a second coefficient corresponding to a via arrangement density with respect to the printed circuit board, and η is a third coefficient corresponding to a positional deviation between a via and a land.

12. The via lifetime calculation method according to claim 8, wherein the process further comprises comparing a calculated lifetime of the via with a requested lifetime set as a lifetime requested for the via to determine whether the calculated lifetime of the via satisfies the requested lifetime.

13. The via lifetime calculation method according to claim 12, wherein the process further comprises outputting the calculated lifetime of the via and a result of the determination.

14. The via lifetime calculation method according to claim 8, wherein instead of the expression $\Delta\varepsilon=\{(L\times\alpha\times\Delta t\times E)/(D\times T)\}\times m$, the amount of distortion is calculated based on an approximate expression which, by statistically analyzing an influence degree of each factor from a result of a stress simulation with factors that affect the amount of distortion of the via as variables, synthesizes a function of each factor and a function including an interaction of each factor, $\Delta\varepsilon=\{a\times f(L)+b\times f(T)+c\times f(D)+d\times f(\alpha)+e\times f(E)+g\times f(L, T, D, \alpha, E)\}\times\Delta t$, where Δε is the amount of distortion, L is the length of the via, α is the thermal expansion coefficient of the base material of the printed circuit board, Δt is the temperature change of the environment in which the printed circuit board is used, E is the Young's modulus of the base material of the printed circuit board, D is the diameter of the via, T is the thickness of the plating in the via, and a, b, c, d, e, and g are coefficients of an approximate expression of a simulation result by a stress simulation using, as the variables, the length of the via, the diameter of the via, the thickness of the plating in the via, the thermal expansion coefficient of the base material of the printed circuit board, the Young's modulus of the base material of the printed circuit board, and the temperature change in the environment in which the printed circuit board.

15. An information processing device comprising:
a memory;
a processor coupled to the memory and configured to:
calculate an amount of distortion occurring in a via of a printed circuit board based on an expression using coefficient m obtained by a stress calculation and a stress simulation which are based on a theory of material dynamics, $\Delta\varepsilon=\{(L\times\alpha\times\Delta t\times E)/(D\times T)\}\times m$, where $\Delta\varepsilon$ is the amount of distortion, L is a length of the via, $\alpha$ is a thermal expansion coefficient of a base material of the printed circuit board, $\Delta t$ is a temperature change of an environment in which the printed circuit board is used, E is a Young's modulus of the base material of the printed circuit board, D is a diameter of the via, and T is a thickness of plating in the via; and
identify a number M based on an expression, $M=N/(n\times 365)$, where M is a lifetime of the via, n is a frequency of the temperature change, and N is the number of cycles of the lifetime satisfying an expression $N^x=C/\Delta\varepsilon$, where X is a fatigue ductility exponent of a material used for plating, and C is a fatigue ductility coefficient of the material used for plating.

16. The information processing device according to claim 15, wherein the amount of distortion is corrected based on information that affects the lifetime.

17. The information processing device according to claim 16, wherein the information includes at least one of a first coefficient corresponding to a land arrangement, a second coefficient corresponding to a via arrangement density with respect to the printed circuit board, a third coefficient corresponding to a positional deviation between a via and a land, a fourth coefficient corresponding a size of the land, a fifth coefficient related to presence or absence of a solid layer, and a sixth coefficient related to a physical property value of a resin filling the via.

18. The information processing device according to claim 15, wherein the amount of distortion is corrected base on an expression $\Delta\varepsilon'=\Delta\varepsilon\times\beta\times\gamma\times\eta$, where $\beta$ is a first coefficient corresponding to a land arrangement, $\gamma$ is a second coefficient corresponding to a via arrangement density with respect to the printed circuit board, and $\eta$ is a third coefficient corresponding to a positional deviation between a via and a land.

19. The information processing device according to claim 15, wherein the processor is configured to compare a calculated lifetime of the via with a requested lifetime set as a lifetime requested for the via to determine whether the calculated lifetime of the via satisfies the requested lifetime.

20. The non-transitory recording medium according to claim 15, wherein instead of the expression $\Delta\varepsilon=\{(L\times\alpha\times\Delta t\times E)/(D\times T)\}\times m$, the amount of distortion is calculated based on an approximate expression which, by statistically analyzing an influence degree of each factor from a result of a stress simulation with factors that affect the amount of distortion of the via as variables, synthesizes a function of each factor and a function including an interaction of each factor, $\Delta\varepsilon=\{a\times f(L)+b\times f(T)+c\times f(D)+d\times f(\alpha)+e\times f(E)+g\times f(L, T, D, \alpha, E)\}\times\Delta t$, where $\Delta\varepsilon$ is the amount of distortion, L is the length of the via, $\alpha$ is the thermal expansion coefficient of the base material of the printed circuit board, $\Delta t$ is the temperature change of the environment in which the printed circuit board is used, E is the Young's modulus of the base material of the printed circuit board, D is the diameter of the via, T is the thickness of the plating in the via, and a, b, c, d, e, and g are coefficients of an approximate expression of a simulation result by a stress simulation using, as the variables, the length of the via, the diameter of the via, the thickness of the plating in the via, the thermal expansion coefficient of the base material of the printed circuit board, the Young's modulus of the base material of the printed circuit board, and the temperature change in the environment in which the printed circuit board.

* * * * *